United States Patent
Paul (10) Patent No.: US 8,604,847 B2
(45) Date of Patent: Dec. 10, 2013

(54) DETECTION OF FAST SUPPLY RAMP IN RESET CIRCUIT

(75) Inventor: Somshubhra Paul, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 13/463,813

(22) Filed: May 3, 2012

(65) Prior Publication Data

US 2013/0293273 A1   Nov. 7, 2013

(51) Int. Cl.
*H03L 7/00* (2006.01)

(52) U.S. Cl.
USPC ............................ 327/142; 327/143; 327/198

(58) Field of Classification Search
USPC ........................................... 32/142, 143, 198
See application file for complete search history.

(56) References Cited

U.S. PATENT DOCUMENTS

| | | | | |
|---|---|---|---|---|
| 4,300,065 | A * | 11/1981 | Remedi et al. | 327/436 |
| 4,591,745 | A * | 5/1986 | Shen | 327/143 |
| 6,879,194 | B1 * | 4/2005 | Caldwell | 327/143 |
| 2003/0011411 | A1 * | 1/2003 | Sterrantino et al. | 327/143 |
| 2005/0057287 | A1 * | 3/2005 | Gossmann | 327/143 |
| 2010/0156477 | A1 * | 6/2010 | Chellappa | 327/143 |

OTHER PUBLICATIONS

"Mixed Signal Microcontroller", Texas Instruments Incorporated, MSP430F673x MSP430F672x, SLAS731, Dec. 2011, pp. 1-120.

* cited by examiner

*Primary Examiner* — Lincoln Donovan
*Assistant Examiner* — Brandon S Cole
(74) *Attorney, Agent, or Firm* — John R. Pessetto; W. James Brady; Frederick J. Telecky, Jr.

(57) ABSTRACT

A method for generating a reset signal in a system on a chip (SoC) is disclosed. A sense signal is generated responsive to a supply voltage provided to the SoC. A reset signal is asserted while the sense signal is below a threshold voltage level. The sense signal may be forced below the threshold value for a period of time determined by a first capacitive time constant circuit. Operation of the first capacitive time constant circuit is inhibited after the sense signal has been above the threshold value level for a second period of time as determined by a second capacitive time constant circuit responsive to the supply voltage. In some embodiments, the first capacitive time constant circuit and the second capacitive time constant circuit may be discharged when the supply voltage falls below a second threshold voltage level, such that the reset signal is again asserted.

14 Claims, 7 Drawing Sheets

DETECTION OF FAST SUPPLY RAMP IN RESET CIRCUIT

FIELD OF THE INVENTION

This invention generally relates to power-on reset pr brown-out reset circuits, and in particular to ultra-low power systems.

BACKGROUND OF THE INVENTION

Every primary system on a chip (SOC) in a system needs a Brown-Out Reset or a Power-on Reset circuit inside, which helps initialise the system to a known state at the first application of voltage from a power supply. A 'primary' SOC in a system refers to one which does not depend on any other device outside to initialise it. Microcontrollers, power management integrated circuits (ICs), standalone digital signal processing (DSP) systems, etc. fall in this category.

Ultra low power Power-On/Brown-out Reset circuits may be used in microcontrollers that are embedded within a system and often rely on capacitive coupling to detect fast supply ramps and dips. However, this method may not reliably distinguish between transients indicating supply faults and transients within allowed supply range and may therefore issue a reset even when a voltage level from the power supply is proper. Typically, the capacitive coupling path is disabled once Reset is lifted indicating proper supply in order to prevent false resets from occurring due to allowed transient changes in the power supply level.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As mentioned above, every primary SOC in a system needs a Brown-Out Reset or a Power-on Reset circuit inside, which helps initialise the system in a known state at the first application of a Power Supply. A 'primary' SOC in a system refers to one which does not depend on any other device outside to initialise it. Microcontrollers, Power Management ICs, standalone DSP systems, etc fall in this category.

Figure 1:
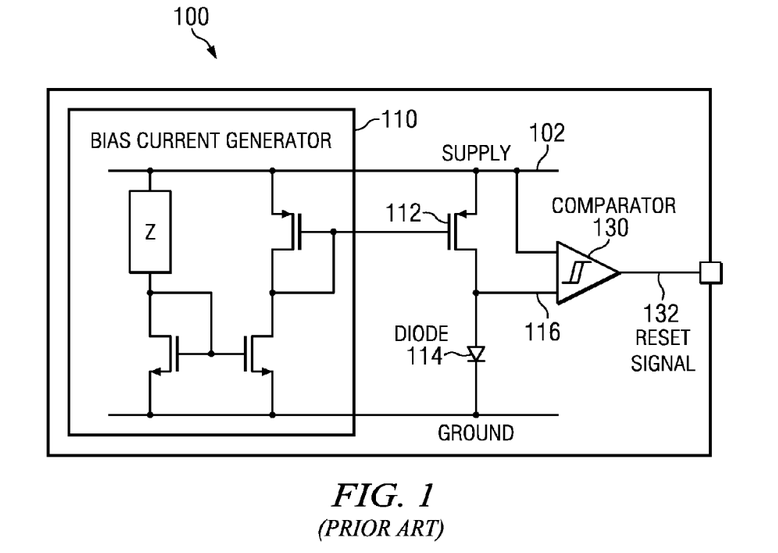
FIGS. 1 and 2 are conceptual schematics of prior art reset circuits.

This Power-On/Brown-Out Reset circuit will herein be referred to as a POR/BOR. A POR/BOR is a Vt based voltage threshold detector, usually implemented by a current pumped through diode connected device. The detector trips when the supply voltage, referred to herein as Vcc, is high enough compared with the Vt scaled by an appropriate factor. FIG. 1 conceptually represents a basic prior art POR/BOR 100. Bias circuit 110 develops a bias current that is mirrored through device 112 to provide a steady current through diode connected sense device 114. Sense device 114 provides sense signal 116 to detection circuit 130 that is configured to assert a reset signal 132 while the sense signal is below a threshold voltage level and to release the reset signal while the sense signal is above the threshold voltage level which implies the supply voltage is greater than the threshold voltage by a scaled amount.

Detection circuit 130 may be conceptualized as a comparator, but its operation differs somewhat from a typical comparator. Detection circuit 130 is configured to assert reset signal 132 while the sense signal 116 is below a threshold voltage level and to release the reset signal while the sense signal is above the threshold voltage level, as long as the supply voltage on supply buss 102 is greater than the sense signal 116 by a scaled amount with reference to reference plane 104. In an embodiment, detection circuit 130 may require the supply voltage to be three times (or some other appropriate ratio) the threshold voltage, or to be a fixed amount greater than the threshold voltage, for example.

The advantage of this type of POR/BOR circuits is that they can operate with very low quiescent current, which is essential for low power devices such as a member of the MSP430 family of microcontrollers, which is available from Texas Instruments, Inc.

However, this type of a circuit has a basic limitation that in the case of fast supply ramps the reset may be lifted without adequate delay, and therefore may not initialize the system properly. This issue may be solved by adding a capacitive-coupled rate detector 220 to the above basic POR/BOR circuit, as illustrated in prior art FIG. 2 POR/BOR circuit 200. In the case of fast supply up-transients, this capacitive coupled rate detector causes the Reset Signal to remain asserted immediately following the transient for a period of time. While voltage on supply bus 102 is rising, capacitor 222 will receive a charging current at a rate determined by trickle charge device 224. As long as a charging current is flowing through capacitor 222, mirror device 226 will clamp sense signal 116 to the reference plane 104 until the capacitor becomes charged through trickle charger 224. As long as the sense signal is held lower than the threshold voltage, detection circuit 130 will assert the reset signal. In this manner, a minimum reset duration is ensured by a time constant, $T_{CC}$, of capacitive coupled rate detector 220. Once a steady state condition is reached on Vcc, capacitive coupled rate detector 220 draws no current.

Figure 2:
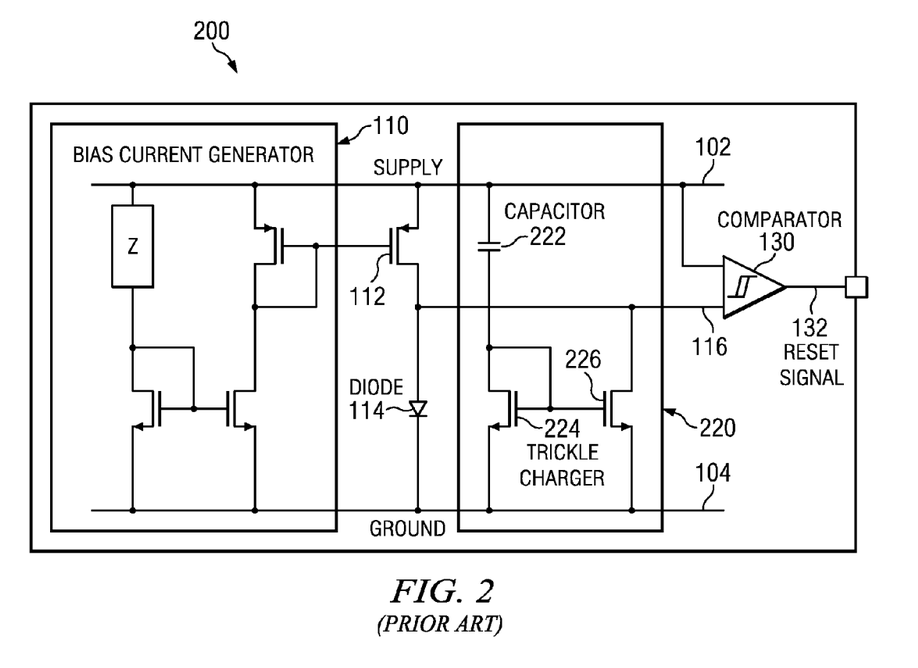

There is a problem with the operation of capacitive coupled detector 220 that is due to capacitive coupling of the supply rail. Detector 220 does not distinguish between the absolute voltage value of supply buss 102 before or after a voltage transient on supply buss 102. Therefore, whenever there is a sizeable transient on the power supply, irrespective of original voltage at the supply, a reset may be issued. Therefore, devices which support a wide supply range, such as microcontrollers intended for flexible supply applications, may incur a false reset when a supply transient is within the allowed supply range. This may place restrictions on the use-cases for SOCs with this kind of prior art POR/BOR scheme. For example, these devices should not be used on systems where the supply voltage for the SOC may switch between different sources; for example, electrical mains to storage battery or to a super cap on the board.

A known solution to this problem is to use the reset output of the POR/BOR circuit itself to disable capacitive coupled rate detection circuit 220 once device has come out of reset. This essentially results in a loop which creates a latch which cannot be reliably initialized since the POR/BOR circuit is what is used to initialize all latches in the system and may result in the system not initializing properly in many cases.

Figure 3:
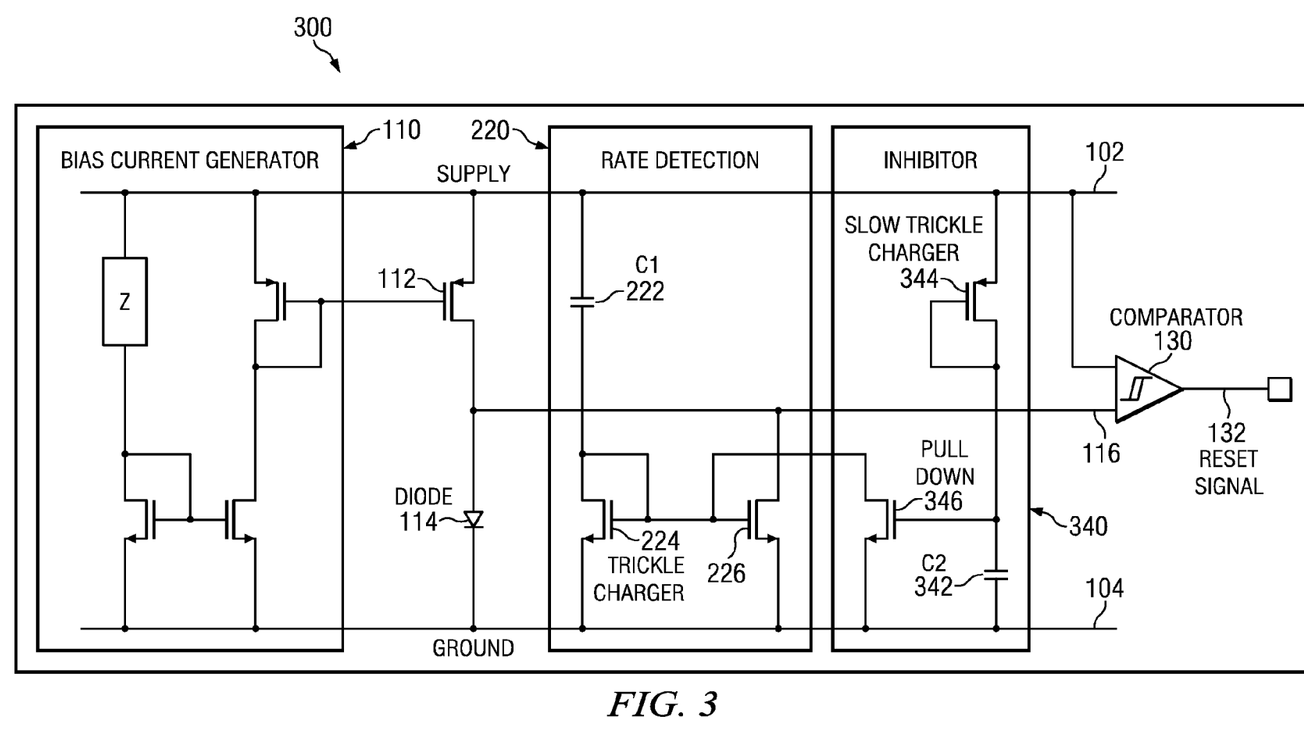
FIGS. 3 and 4 are conceptual schematics of an improved reset circuit.

FIG. 3 is a conceptual schematic of an improved POR/BOR reset circuit 300. To solve the problem highlighted above, an additional circuit is added which is used to detect the voltage on power supply buss 102 and inhibit operation of capacitive coupled rate detection circuit 220 when there is a sufficient supply voltage level. This circuit will typically have a time constant ($T_{CC-i}$) greater than the $T_{CC}$ time constant of the rate detection circuit 220. The method to detect presence of the supply voltage may be similar to but complimentary to capacitive coupled rate detection circuit 220.

Inhibitor circuit 340 includes capacitor C2 342 coupled to ground reference 104 with a trickle charger 344 coupled the supply buss 102. The size of capacitor C2 may be same as that of capacitor C1 222 in rate detection circuit 220, while trickle charger 344 to supply may be weaker than the trickle charger 224 in rate detection circuit 220. This results in $T_{CC-i}$ being greater than $T_{CC}$. Other embodiments may use different configurations to produce different time constant values. For example, different sizes of capacitors may be used with similar strength trickle chargers, or different size capacitors and different strength trickle charges may be used. Once a steady state condition is reached on Vcc, capacitive coupled inhibitor circuit 340 draws essentially no current.

In the current embodiment, $T_{CC-i}$ is selected to be twice the value of $T_{CC}$. However, other embodiments may have larger, or smaller, time constant ratios, as long as Tcc-i is greater than Tcc.

During power-on operation, in case of a fast supply ramp up, the capacitive coupled rate detector 220 still comes into the picture since the capacitor C2 is discharged. The capacitor C2 takes more time to charge up than capacitor C1 because of its slower time constant.

During ongoing operation when a supply voltage is present on supply buss 102, capacitor C2 is charged up and thereby inhibits operation of rate detection circuit 220 by using NMOS pull-down device 346 to pull sense signal 116 below the sense threshold level. Therefore, further transients on power supply do not cause a reset to be issued.

Figure 4:
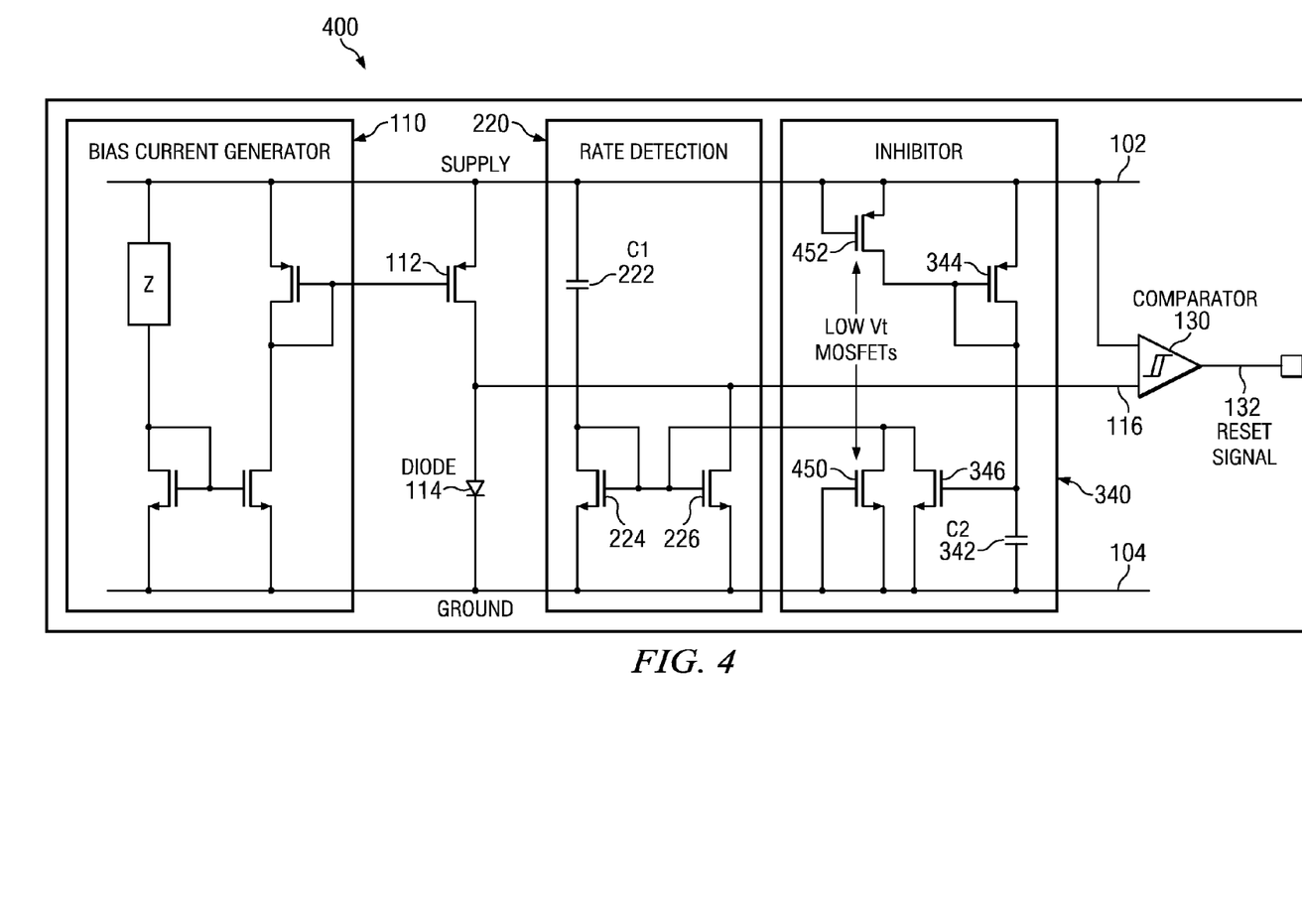

FIG. 4 is a conceptual schematic of a further improved POR/BOR reset circuit 400. A second problem may occur in case of a fast supply dip and recovery. In this case, capacitive coupled rate detector 220 may not be discharged adequately during a fast supply dip. Therefore, a needed reset may not be issued when the supply recovers quickly, which is a manifestation of the original problem that capacitive coupled detector circuit 220 is intended to prevent. This may result in fast voltage dips, such as voltage dips of the order of hundreds of nano-seconds, not producing a reset. The operation of an SoC that is being managed by BOR 300 may be corrupted due to lack of an adequate reset after a transient power loss.

For correct operation during short transient supply dips, capacitors C1 and C2 both need to be discharged rapidly during a supply dip. This may be achieved by adding low Vt MOS transistors 450, 452 with drains connected to the gates of trickle charger 226 and 344. The source and gate of discharge device 450 is connected to ground reference 104 and the source and gate of discharge device 452 is coupled to supply buss 102. During normal operation, low Vt devices 450, 452 are switched off. During a decrease in supply voltage, low Vt devices 450, 452 will turn on due to the residual charge on capacitors C1, C2 respectively and thereby discharge capacitors C1, C2.

In this manner, when a transient goes below an operating threshold, when the voltage again rises the brownout reset circuit will operate as described above and assert the reset signal while capacitors C1, C2 recharge. However, if the voltage transient is such that the supply voltage does not drop below the operating threshold, then capacitors C1, C2 retain enough charge to prevent the assertion of a reset when it is not needed.

CMOS transistors typically sit inside doped wells: an NMOS device sits in a p-doped well, a PMOS device sits in an n-doped well. During the implant process for the well, there may be two or three implants. For example, the NMOS p-well would get the deep P-type dopant that forms the well, a fairly shallow anti-punch through doping, and a shallow surface threshold adjust implant. The standard threshold implant would produce a nominal device. There may then be options for Low Vt and low power transistors. These additional implants either decrease the Vt to give a faster transistor but with higher off state leakage or increase the Vt to give a slower transistor but much lower off state leakage and thus low power. An additional mask layer may be required to control the doping that changes the VT for those transistors that are fast or low power.

In another embodiment, a lower vt device may be produced by using a MOSFET with a thinner oxide. Although this requires a different mask, many SoC devices typically use thinner oxide for faster transistors. Therefore, in such an SoC, producing a lower vt device may be done at no extra cost.

Low Vt MOSFETs 450, 452 can be sized to achieve sufficient capacitor discharge rates. The discharge devices do not need to be a single MOSFET, but can be multiple MOSFETs stacked to achieve a desired threshold voltage. Metal layer options may allow tuning of the circuit.

Figure 5:
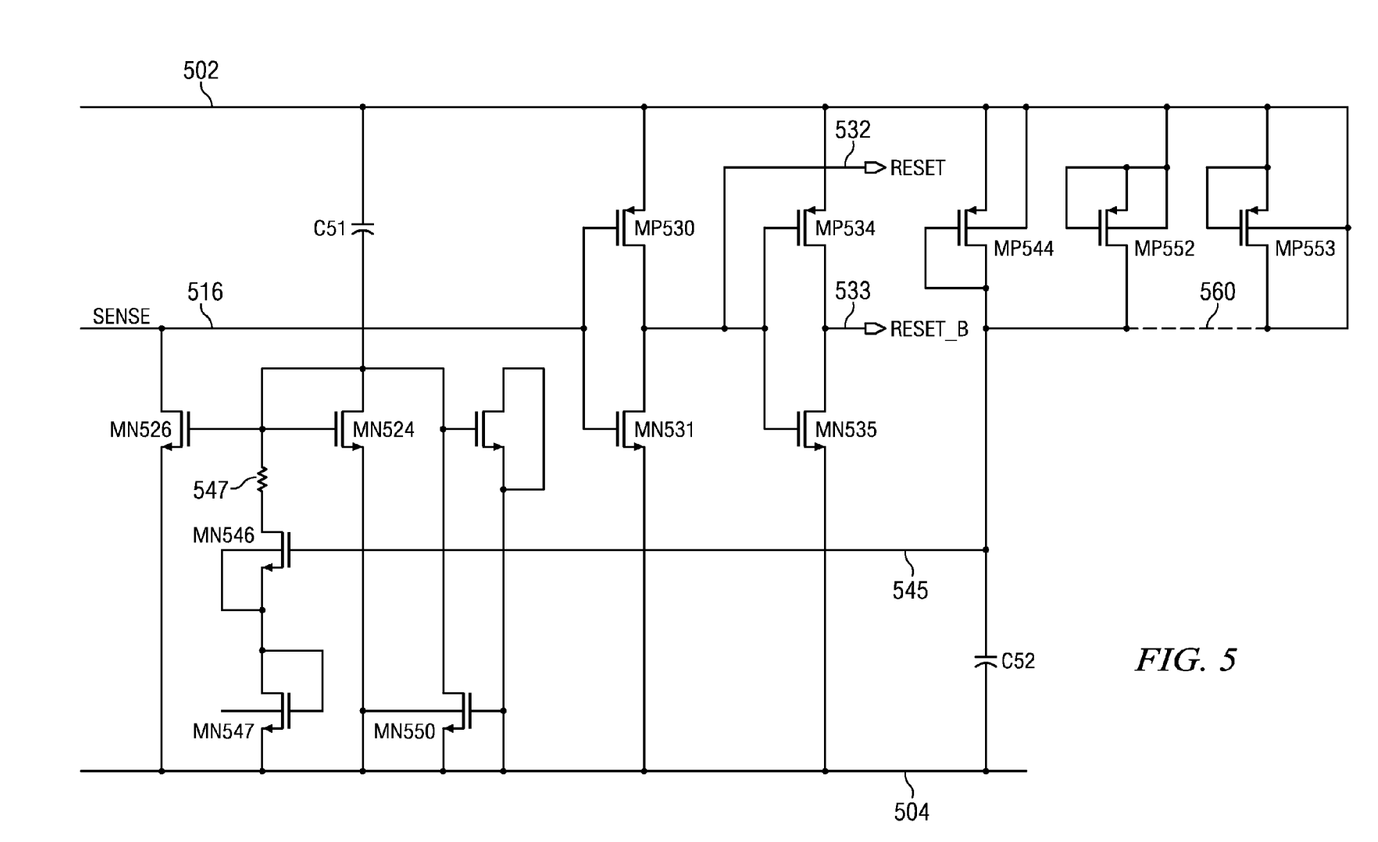
FIG. 5 is a detailed schematic of the reset circuit of FIG. 4.

FIG. 5 is a detailed schematic of improvements to reset circuit 400 of FIG. 4. Sense signal 516 is generated in response to a supply voltage provided to the SoC on supply buss 502 using a Vt-based reference device, not shown, such as diode 114. MP530 and MN531 form a comparator that asserts reset signal 532 while the sense signal is below a threshold voltage level and releases the reset signal while the sense signal is above the threshold voltage level and the supply voltage is sufficiently high to operate devices MP530, MN531. The threshold voltage level is determined by the Vt of devices MP530, MN531. Devices MP534, MN535 provide a buffered reset signal 533.

Capacitor C51 is charged via trickle charge device MN524 to reference plane 504 in response to voltage on supply buss 502 to form a capacitive coupled rate detection circuit having a time constant Tcc. Clamp device MN526 forces the sense signal below the threshold value for a period of time determined by time constant Tcc responsive to a rise in the supply voltage that is great enough to turn on device MN526.

Capacitor C52 is charged via trickle charge device MP544 in response to voltage on supply buss 502 to form a capacitive coupled inhibitor circuit having a time constant Tcc-i. Control signal 545 is connected to the gate of MN546 to produce a signal 547 that is coupled to the gate of clamp device MN526 to inhibit operation of the capacitive coupled rate detection circuit after the sense signal has been above the threshold value level for a period of time based on time constant Tcc-i in response to the supply voltage. Diode connected device MN547 raises the threshold of device MN546 to two Vt.

Low Vt discharge device MP552 is coupled to capacitor C52 and low Vt discharge device MN550 is coupled to capacitor C51. The discharge devices respond to drops in voltage level on supply buss 502 as described above and allow the capacitive coupled rate detection circuit C51, MN524 to again clamp sense signal 516 and thereby cause the reset signal to be asserted when the supply voltage drops below an operational threshold value.

Metal option 560 allows addition of one or more extra discharge devices MP553 in parallel with MP552. Similarly, another metal option may allow tuning of discharge device MN550.

Figure 6:
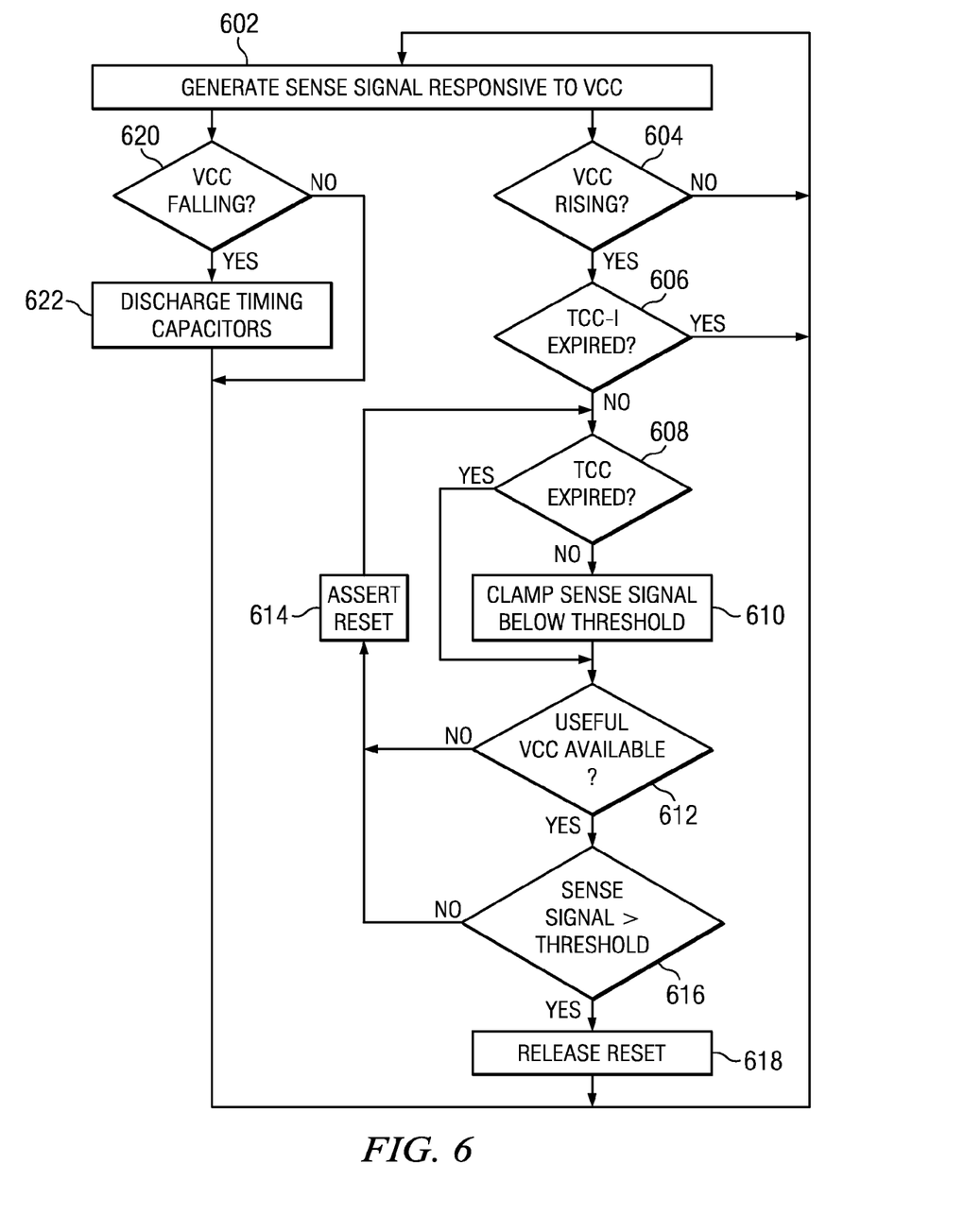
FIG. 6 is a flow chart of power-on and brown-out reset operation.

FIG. 6 is a flow chart of a power-on and brown-out reset operation that may be performed by embodiments of the present invention within a power management module contained within a system on a chip, for example. As described above, a sense signal is generated 602 that is responsive to a supply voltage, Vcc, provided to the SoC. The sense signal is generated using known techniques, such as by a calibrated current provided by a bias circuit to a diode. A voltage developed across the diode in response to the bias current is proportional to the supply voltage, until the diode threshold voltage is reached and it begins to conduct without a further significant increase in voltage drop.

While Vcc is rising 604, a capacitive coupled timing circuit begins a time period Tcc-i that is determined by a value of the capacitor and the amount of current passed by a trickle charge device. When the Tcc-i time period has expired, further reset operation of the power management module is inhibited 606.

While the Tcc-i time period is active, a second time period Tcc is monitored 608 by another capacitively coupled timing circuit that is responsive to Vcc. During the Tcc time period, the sense signal is clamped 610 to a low value so that a reset signal generated by the power management module will remain asserted 614.

As long as the Vcc remains below a useful voltage level 612, the reset signal remains asserted 614. The useful voltage level is the minimum Vcc level that will support correct operation of the SoC.

Once Vcc reaches the useful voltage level 612, then the reset signal remains asserted 614 for as long as the sense signal remains below a threshold value, or is clamped below 610 the threshold value. The threshold value is determined by a detection circuit that detects when the sense signal has risen to a value somewhat near the diode threshold voltage level of the sense circuit.

Once Vcc has reached a useful level 612 and the sense signal has exceeded the threshold value 616, then the reset signal is released 618 and normal functional operation of the SoC may commence.

During functional operation of the SoC, Vcc may drop 620 due to various factors, such as switching from one source to another or due to a significant load increase, for example. In some cases the drop in Vcc may remain within operational parameters of the SoC and functional operation can continue un-abated. In other cases, the drop may be low enough to cause circuit malfunction. In this case, the SoC needs to again enter a reset condition. While Vcc is dropping, the two timing capacitors are discharged 622 so that when Vcc again begins to rise 604, Tcc-i and Tcc timing periods will again cause the reset signal to be reset 614.

The improved POR/BOR circuit is very robust and reliable, and enables a wide range of supply profiles to be allowed on a device. This allows the device to be used with a wide range of applications without compromising on the basic low-power needs of devices. Examples of systems which have power supply profiles with large transients within allowed supply voltage range include energy meters where the device switches frequently between mains power supply and on-board batteries or storage capacitors in case of power failures. MSP430F6736 is one such energy-metering device that is available from Texas Instruments. Another example is a battery powered device where there may be sharp transients on the supply when other high power applications within the system turn on, such as a GSM Power Amplifier in a cell phone.

The improvements described herein require no static or steady state current, and only a very small current (nano-amps for micro-seconds) at startup. Therefore, it does not impact the power consumption goals of the device in any way. This is of special importance in devices which may be in low power modes (sub-1 uA quiescent current) for extended periods of time.

The improvements described herein require only a small amount of space and increases the overall POR/BOR circuit area by only about 10-20%. For example, in a current process, only 3000-4000 sq u are needed, which is negligible even for small device of 6-7 sq mm size.

System Example

Figure 7:
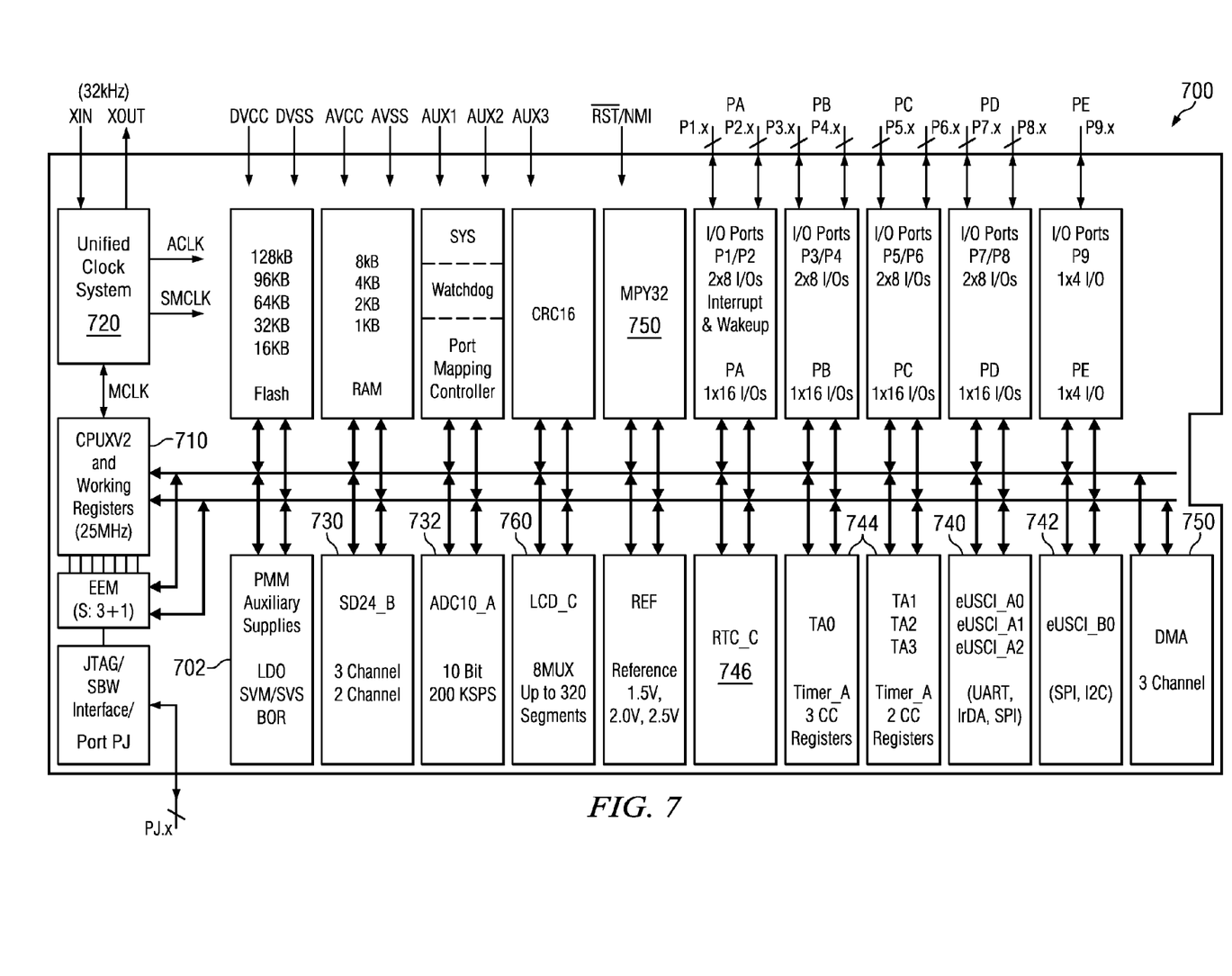
FIG. 7 is a block diagram of a system on a chip that includes the reset circuit of FIG. 5.

FIG. 7 is a block diagram of a system on a chip 700 that includes the reset circuit of FIG. 5 within power management module 702. FIG. 7 is representative of the MSP430 family of ultra-low power microcontrollers available from Texas Instruments. The Texas Instruments MSP430 family of ultra-low-power microcontrollers includes several devices featuring different sets of peripherals targeted for various applications. The architecture, combined with extensive low-power modes, is optimized to achieve extended battery life in portable applications. The device features a powerful 16-bit RISC CPU 710 with 16-bit registers and constant generators that contribute to maximum code efficiency. A digitally controlled oscillator (DCO) 720 allows wake-up from low-power modes to active mode in 3 μs (typical).

The microcontroller configurations may include high-performance 24-bit sigma-delta A/D converters 730, a 10-bit analog-to-digital (A/D) converter 732, four enhanced universal serial communication interfaces (three eUSCI_A 740 and one eUSCI_B) 742, four 16-bit timers 744, hardware multiplier 750, DMA 750, real-time clock module with alarm capabilities 746, LCD driver 760 with integrated contrast control, auxiliary supply system 702, and up to 72 I/O pins in 100-pin devices and 52 I/O pins in 80-pin devices. More detailed descriptions are available in the "Mixed Signal Microcontroller" data sheet, SLAS731, December 2011, Texas Instruments, which is incorporated by reference herein.

A typical applications for these devices are 2-wire and 3-wire single-phase metering, including tamper-resistant meter implementations. However, there are many battery based devises and systems that can benefit from ultra-low power operation.

The PMM 702 includes an integrated voltage regulator that supplies the core voltage to the device and contains programmable output levels to provide for power optimization. The PMM also includes supply voltage supervisor (SVS) and supply voltage monitoring (SVM) circuitry, as well as brown-out protection. The brownout circuit is implemented to provide the proper internal reset signal to the device during power-on and power-off as described in more detail above.

The SVS/SVM circuitry detects if the supply voltage drops below a user-selectable level and supports both supply voltage supervision (the device is automatically reset) and supply voltage monitoring (the device is not automatically reset). SVS and SVM circuitry is available on the primary supply and core supply.

Figure 8:
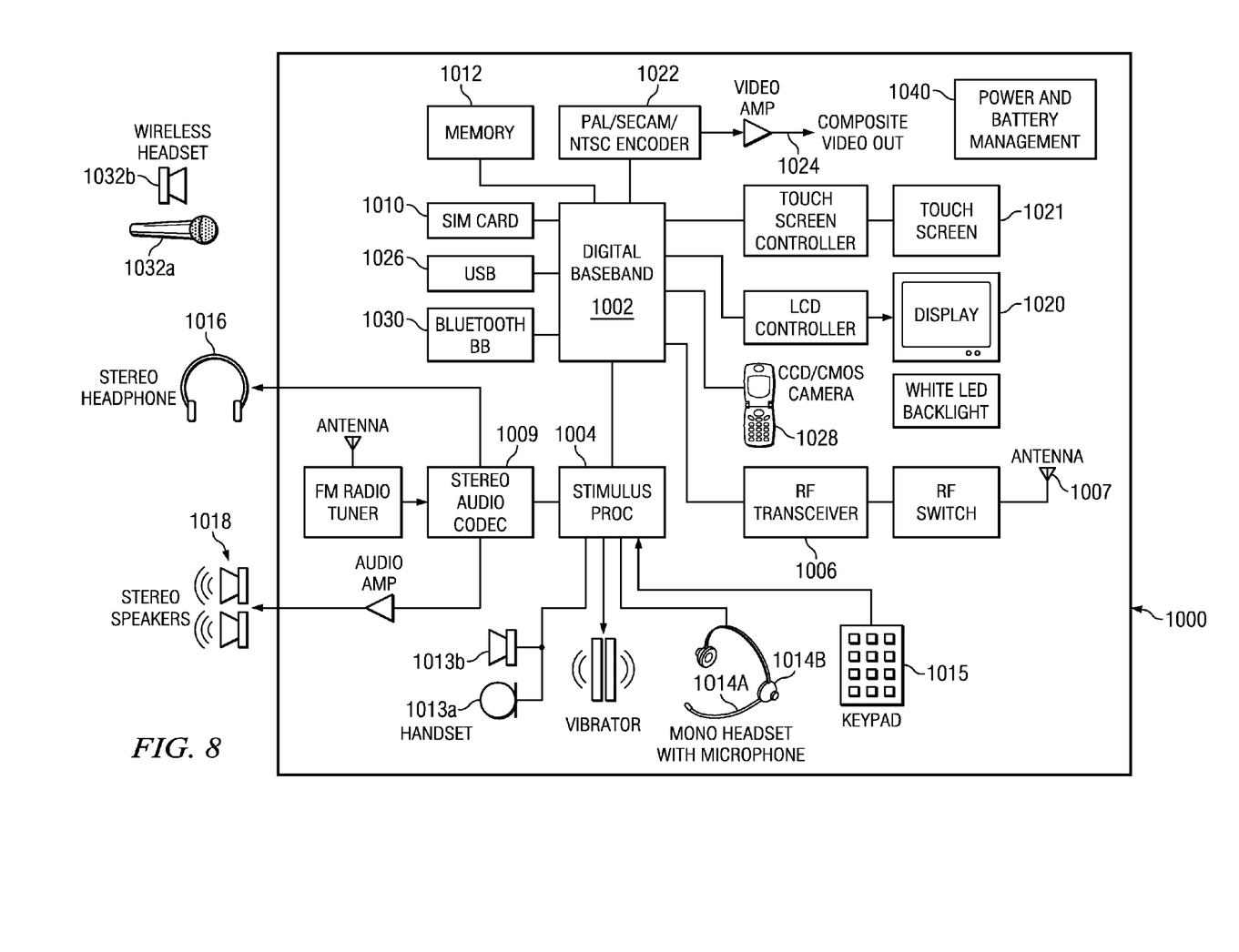
FIG. 8 is a block diagram of a cellular telephone that includes an improved reset circuit.

FIG. 8 is a block diagram of an exemplary mobile cellular phone 1000 that includes an embodiment of the present invention. Digital baseband (DBB) unit 1002 may include a digital processing processor system (DSP) that includes embedded memory and security features. Stimulus Processing (SP) unit 1004 receives a voice data stream from handset microphone 1013a and sends a voice data stream to handset mono speaker 1013b. SP unit 1004 also receives a voice data stream from microphone 1014a and sends a voice data stream to mono headset 1014b. Usually, SP and DBB are separate ICs. In most embodiments, SP does not embed a programmable processor core, but performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

RF transceiver 1006 is a digital radio processor and includes a receiver for receiving a stream of coded data frames from a cellular base station via antenna 1007 and a transmitter for transmitting a stream of coded data frames to the cellular base station via antenna 1007. RF transceiver 1006 is coupled to DBB 1002 which provides processing of the frames of encoded data being received and transmitted by cell phone 1000.

DBB unit 1002 may send or receive data to various devices connected to universal serial bus (USB) port 1026. DBB 1002 can be connected to subscriber identity module (SIM) card 1010 and stores and retrieves information used for making calls via the cellular system. DBB 1002 can also connected to memory 1012 that augments the onboard memory and is used for various processing needs. DBB 1002 can be connected to Bluetooth baseband unit 1030 for wireless connection to a microphone 1032a and headset 1032b for sending and receiving voice data. DBB 1002 can also be connected to display 1020 and can send information to it for interaction with a user of the mobile UE 1000 during a call process. Touch screen 1021 may be connected to DBB 1002 for haptic feedback. Display 1020 may also display pictures received from the network, from a local camera 1028, or from other sources such as USB 1026. DBB 1002 may also send a video stream to display 1020 that is received from various sources such as the cellular network via RF transceiver 1006 or camera 1028. DBB 1002 may also send a video stream to an external video display unit via encoder 1022 over composite output terminal 1024. Encoder unit 1022 can provide encoding according to PAL/SECAM/NTSC video standards. In some embodiments, audio codec 1009 receives an audio stream from FM Radio tuner 1008 and sends an audio stream to stereo headset 1016 and/or stereo speakers 1018. In other embodiments, there may be other sources of an audio stream, such a compact disc (CD) player, a solid state memory module, etc.

Power and battery management module (PMM) 1040 includes an integrated voltage regulator that supplies the core voltage to the device and contains programmable output levels to provide for power optimization. The PMM also includes supply voltage supervisor (SVS) and supply voltage monitoring (SVM) circuitry, as well as brownout protection. The brownout circuit is implemented to provide the proper internal reset signal to the device during power-on and power-off as described in more detail above. The SVS/SVM circuitry detects if the supply voltage drops below a user-selectable level and supports both supply voltage supervision (the device is automatically reset) and supply voltage monitoring (the device is not automatically reset). SVS and SVM circuitry is available on the primary supply and core supply. As described in more detail above, a brownout condition may occur when RF transceiver performs transmission bursts during low battery condition. In this case, the brownout protection functions as described above to prevent spurious resets, while still provide proper reset operation when battery power drops too low to sustain proper operation.

Other Embodiments

While the invention has been described with reference to illustrative embodiments, this description is not intended to be construed in a limiting sense. Various other embodiments of the invention will be apparent to persons skilled in the art upon reference to this description. For example, the timing capacitors may be implemented as MOS devices, discrete capacitors, mirrored capacitors or any other capacitor technology now known or later developed. The trickle charger device may be an active device or a simple passive device such as a resistor. While described as a CMOS system herein, other embodiments of the POR/BOR circuit may be implemented according to the principles described herein for other types of semiconductor processes now known or later developed.

Embodiments of the power-on reset and brown-out reset circuits described herein may be provided on any of several types of digital systems: digital signal processors (DSPs), general purpose programmable processors, application specific circuits, or systems on a chip (SoC) such as combinations of a DSP and a reduced instruction set (RISC) processor together with various specialized accelerators. A stored program in an onboard or external (flash EEP) ROM or FRAM may be used to store program code. Analog-to-digital converters and digital-to-analog converters provide coupling to the real world, modulators and demodulators (plus antennas for air interfaces) can provide coupling for waveform reception of video data being broadcast over the air by satellite, TV stations, cellular networks, etc or via wired networks such as the Internet.

Certain terms are used throughout the description and the claims to refer to particular system components. As one skilled in the art will appreciate, components in digital and analog systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for generating a reset signal in a system on a chip (SoC), the method comprising:
    generating a sense signal responsive to a supply voltage provided to the SoC;
    asserting a reset signal while the sense signal is below a threshold voltage level and releasing the reset signal while the sense signal is above the threshold voltage level;
    forcing the sense signal below the threshold value for a period of time determined by a first capacitive time constant circuit responsive to a rise in the supply voltage; and
    inhibiting operation of the first capacitive time constant circuit after the sense signal has been above the threshold value level for a second period of time as determined by a second capacitive time constant circuit responsive to the supply voltage.

2. The method of claim 1, further comprising resetting the first capacitive time constant circuit and the second capacitive time constant circuit when the supply voltage falls below a second threshold voltage level, such that the reset signal is again asserted.

3. The method of claim 2, wherein resetting the first capacitive time constant circuit and the second capacitive time constant circuit occurs in response to a transient reduction in supply voltage below the second threshold voltage level.

4. The method of claim 1, wherein the first capacitive time constant circuit and the second capacitive time constant circuit do not consume power after they are fully charged.

5. A system on a chip (SOC), comprising:
    a supply buss and a reference plane;
    a reset circuit coupled between the supply buss and to the reference plane, the reset circuit comprising:
    a sense circuit operable to generate a sense signal responsive to a supply voltage provided to the SoC on the supply buss;
    a detection circuit operable to assert a reset signal while the sense signal is below a threshold voltage level and to release the reset signal while the sense signal is above the threshold voltage level;
    a capacitive coupled rate detection circuit coupled between the supply buss and the reference plane with an output controllably coupled to the sense circuit, operable to force the sense signal below the threshold value for a period of time responsive to a rise in the supply voltage; and
    a capacitive coupled timing circuit coupled between the supply buss and the reference plane with an output controllably coupled to the first capacitive timing circuit, operable to inhibit operation of the capacitive coupled rate detection circuit after the sense signal has been above the threshold value level for a second period of time responsive to the supply voltage.

6. The SoC of claim 5, further comprising a discharge circuit coupled to the capacitive coupled rate detection circuit and another discharge circuit coupled to the capacitive coupled timing circuit operable to discharge the capacitive coupled rate detection circuit and the capacitive timing circuit when the supply voltage falls below a second threshold voltage level, such that the sense signal is forced below the threshold value by the capacitive coupled rate detection circuit for a period of time.

7. The SoC of claim 6, wherein discharging the capacitive coupled rate detection circuit and the capacitive timing circuit occurs in response to a transient reduction in supply voltage below the second threshold voltage level.

8. The SoC of claim 5, wherein the capacitive coupled rate detection circuit and the capacitive timing circuit each block current flow during steady state operation.

9. The SoC of claim 5, wherein the capacitive coupled rate detection circuit comprises a capacitor coupled to the supply buss in series with a trickle charger coupled to the reference plane.

10. The SoC of claim 9, wherein the discharge circuit comprises a low Vt MOS device coupled in series with the capacitor to the reference plane.

11. The SoC of claim 5, wherein the capacitive timing circuit comprises a second capacitor coupled to the ground plane in series with trickle charge coupled to the supply buss.

12. The SoC of claim 11, wherein the other discharge circuit comprises a low Vt MOS device coupled in series with the second capacitor and the supply buss.

13. The SoC of claim 5 further comprising a processor coupled to a memory holding processor executable instructions, the processor being coupled to the reset signal.

14. The SoC of claim 13 being comprised within a cellular telephone, the cellular telephone, further comprising:
    a battery coupled to the supply buss and the reference plane of the SoC; and
    a radio frequency transmitter coupled to the battery.

* * * * *